United States Patent [19]
Kumar et al.

[11] Patent Number: 5,544,112
[45] Date of Patent: Aug. 6, 1996

[54] WORD LINE DRIVER CIRCUIT

[75] Inventors: Manoj Kumar; Joseph M. Poplawski, Jr., both of Austin, Tex.

[73] Assignee: International Business Machines Corporation, Armonk, N.Y.

[21] Appl. No.: 457,704

[22] Filed: Jun. 2, 1995

[51] Int. Cl.⁶ .......................... G11C 8/00; H03K 19/017
[52] U.S. Cl. .................... 365/230.06; 326/17; 326/88
[58] Field of Search ................ 365/230.06, 185.23; 326/88, 17

[56] References Cited

U.S. PATENT DOCUMENTS

| | | | |
|---|---|---|---|
| 3,980,899 | 9/1976 | Shimada et al. | 365/230.06 |
| 4,195,238 | 3/1980 | Sato | 365/230.06 |
| 4,610,002 | 9/1986 | Kaneko | 365/206 |
| 4,798,977 | 1/1989 | Sakui et al. | 365/230.06 |
| 4,951,259 | 8/1990 | Sato et al. | 365/230.06 |
| 5,265,052 | 11/1993 | D'Arrigo et al. | 365/230.06 |
| 5,412,331 | 5/1995 | Jun et al. | 365/230.06 |
| 5,426,603 | 6/1995 | Nakamura et al. | 365/149 |
| 5,467,032 | 11/1995 | Lee | 365/230.06 X |

*Primary Examiner*—Son Dinh
*Attorney, Agent, or Firm*—Kelly K. Kordzik; Winstead Sechrest & Minick P.C.; Mark E. McBurney

[57] ABSTRACT

A word line driver circuit operable for receiving address signals from a decoder circuit and for gating these address signals to be outputted as a word line signal to one or more memory cells within a RAM. The driver circuit prevents oscillations of the outputted word line signal by not allowing any internal nodes between circuit elements to have a floating potential. This function is provided by a plurality of circuit elements arranged in a unique manner so that the internal nodes are not allowed to float.

10 Claims, 4 Drawing Sheets

WORD LINE DRIVER CIRCUIT

TECHNICAL FIELD OF THE INVENTION

The present invention relates in general to data processing systems, and in particular, to a word line driver circuit for accessing memory cells within a random access memory.

BACKGROUND OF THE INVENTION

A random access memory ("RAM") array is basically constructed of memory cells as storage units arranged at the intersections of a plurality of word lines arranged in the row direction and a plurality of bit lines (also called digit lines) arranged in the column direction. Among the plurality of word lines, only one word line is set at a selected level and the memory cells coupled to the selected word line are enabled so as to output data to the bit lines from the enabled memory cells during a read cycle, and the data is forced from the write driver to the bit lines into the enabled memory cells in a write cycle. Thus, the word line driver circuit is one of the most crucial circuits in a memory array. If the word line driver circuits are not completely reliable, then there is the possibility that word lines may be erroneously selected resulting in the reading and writing of erroneous data.

Essentially, when a word line goes valid (e.g., a "high" voltage level is placed on the word line by the driver circuit), a memory cell(s) is selected. When the word line is turned off (e.g., a ground voltage potential is placed on the word line), then the memory cell(s) is deselected.

Referring to FIG. 2, there is illustrated a prior art word line driver circuit. Signals IN1 and IN2 are the two inputs of the circuit and signal WL is the output. Signals IN1 and IN2 may be the decoded row address for accessing memory cells. This word line driver circuit has four operational states:

(1) When signal IN1 is low and signal IN2 is high, the circuit is in a "deselected" operational state (output signal WL is not activated). In this instance, node 210 is driven high and signal WL is set to GND (ground voltage potential). P-channel field-effect transistor ("FET") 204 is switched on pulling node 211 to a voltage potential supplied by voltage supply VDD. This causes node 212 to have a ground potential. Node 213 is caused to go to a voltage potential of VDD minus the threshold voltage across n-channel FET device 206.

(2) Both signals IN1 and IN2 are low. This results in the same "deselected" operational state as in (1) above, except that node 211 is now floating high.

(3) Both signals IN1 and IN2 are high. This causes node 210 to be at a high potential (VDD), which forces output signal WL to be low. Device 204 turns on, which causes node 211 to have a high potential and causes node 212 to have a ground potential.

(4) Input signal IN1 is high and input signal IN2 is low, resulting in a "selected" operational state of the driver circuit (i.e., output signal WL is activated). This forces node 210 to a ground potential resulting in a high potential signal at output WL. If output WL is high, this causes n-channel device 206 to turn on, or to become conducting, and also causes device 204 to turn off. The low state of signal IN2 turns device 205 off. With both devices 204 and 205 off, node 211 is in a floating state. During a long cycle (often greater than 300 MHz), isolated node 211 will float towards a ground potential causing device 201 to conduct. In this situation, signal IN2 is trying to pull node 210 to a ground potential while device 201 is trying to pull node 210 to a high (VDD) potential. At the same time that node 211 is floating towards a ground potential, inverter 209 turns on, forcing node 212 to a VDD potential, which turns on device 207. This results in device 207 trying to pull output signal WL towards a ground potential, while inverter 208 is trying to keep signal WL at a VDD potential. These conditions will cause output signal WL to oscillate. Oscillations in the driver circuit result in increased power consumption.

U.S. Pat. Nos. 4,951,259, 4,610,002, 4,195,238, and 3,980,899 disclose driver circuits that prevent the output word line signal WL from floating. However, none of these disclosed circuits teaches a word line driver circuit containing no floating internal nodes. Floating internal nodes may cause oscillations of the driver circuit.

SUMMARY OF THE INVENTION

The present invention satisfies the foregoing needs by providing a word line driver circuit operable for receiving address signals from a decoder circuit and for gating these address signals to be outputted as a word line signal to one or more memory cells within a RAM. The driver circuit prevents oscillations in the circuit by not allowing any internal nodes between circuit elements to have a floating potential. This function is provided by a plurality of circuit elements arranged in a unique manner so that the internal nodes are not allowed to float.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION OF A PREFERRED EMBODIMENT OF THE INVENTION

Figure 1:
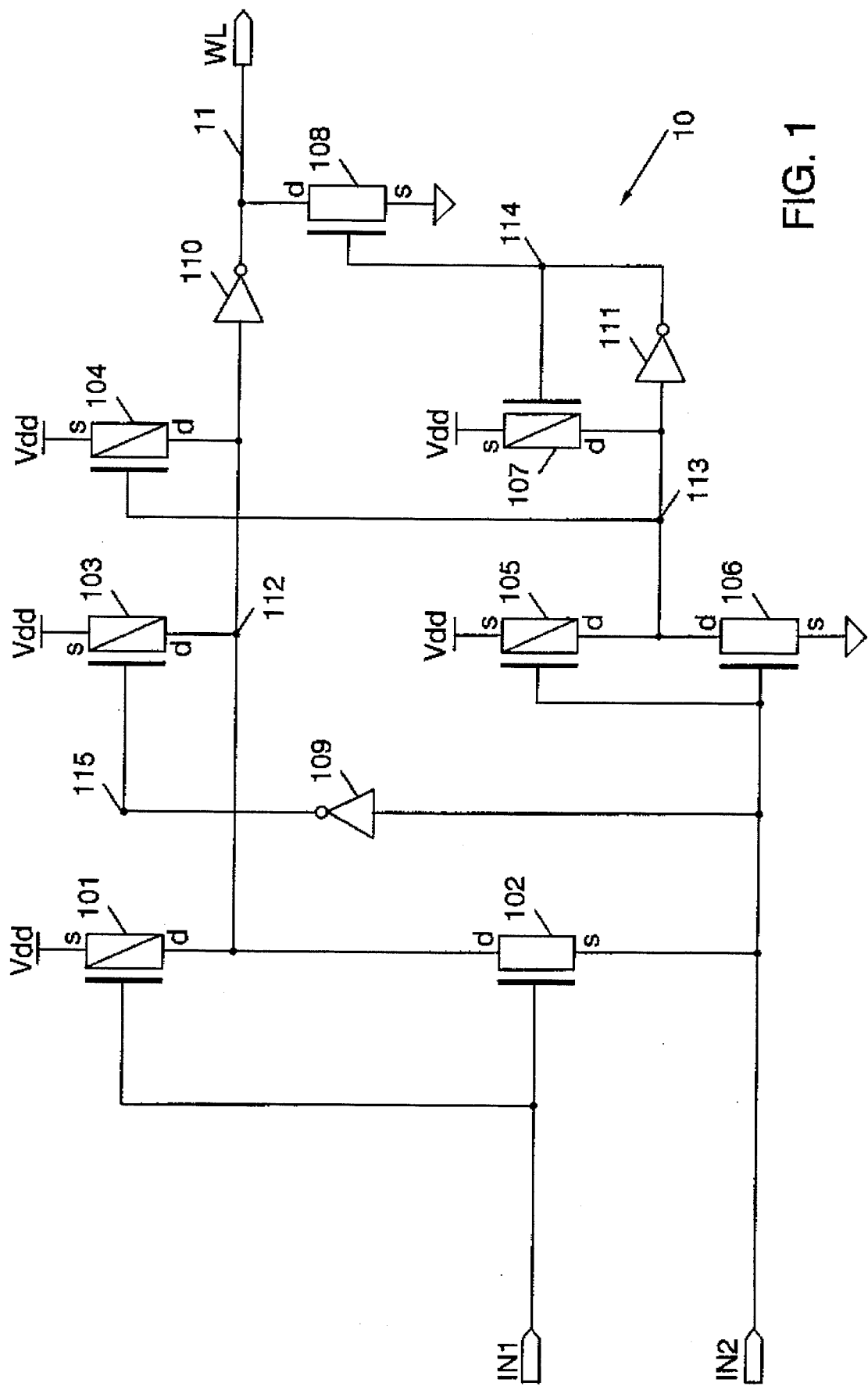
FIG. 1 illustrates a word line driver circuit in accordance with the present invention.
Figure 2:
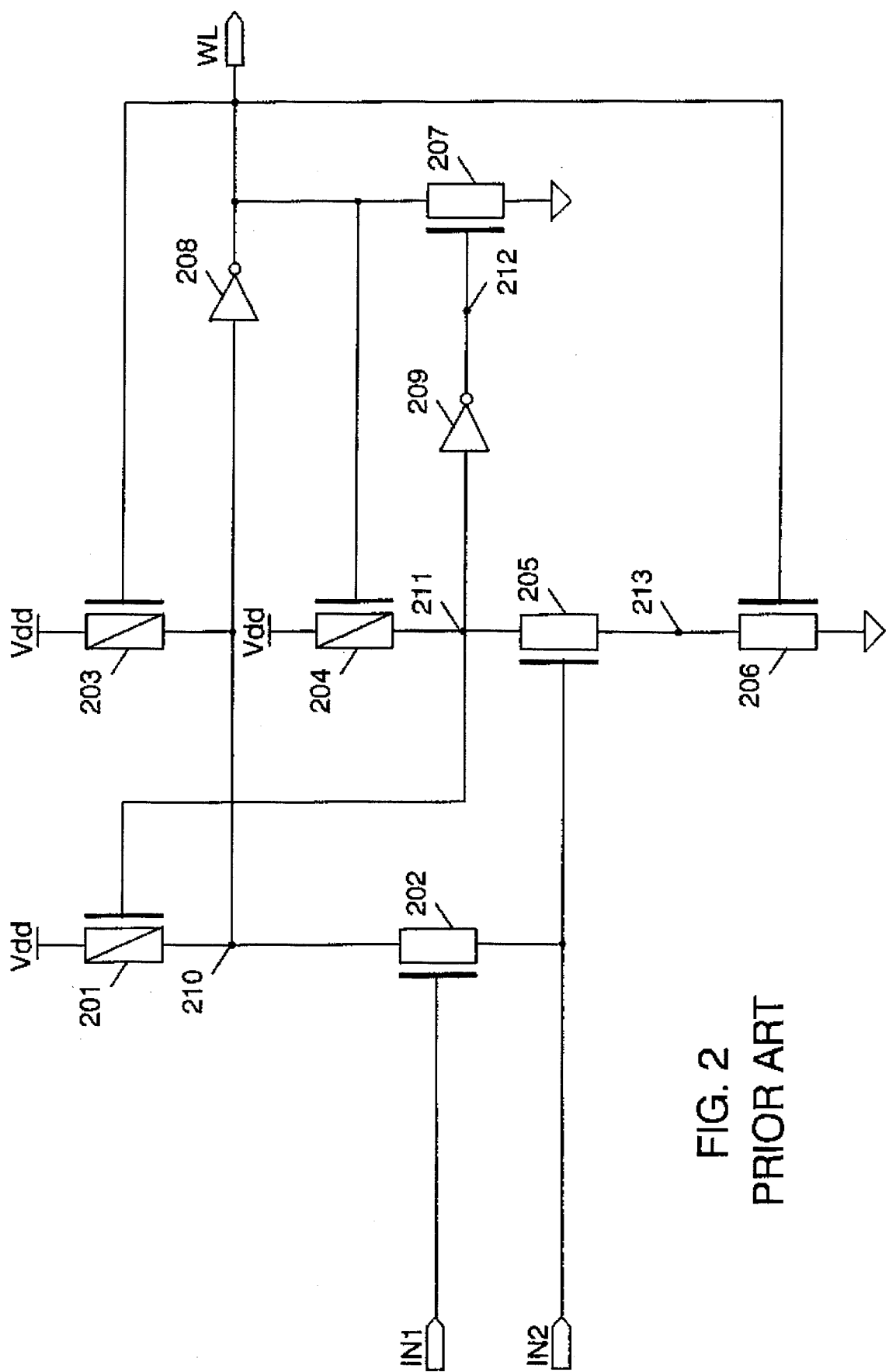
FIG. 2 illustrates a prior art word line driver circuit.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 3:
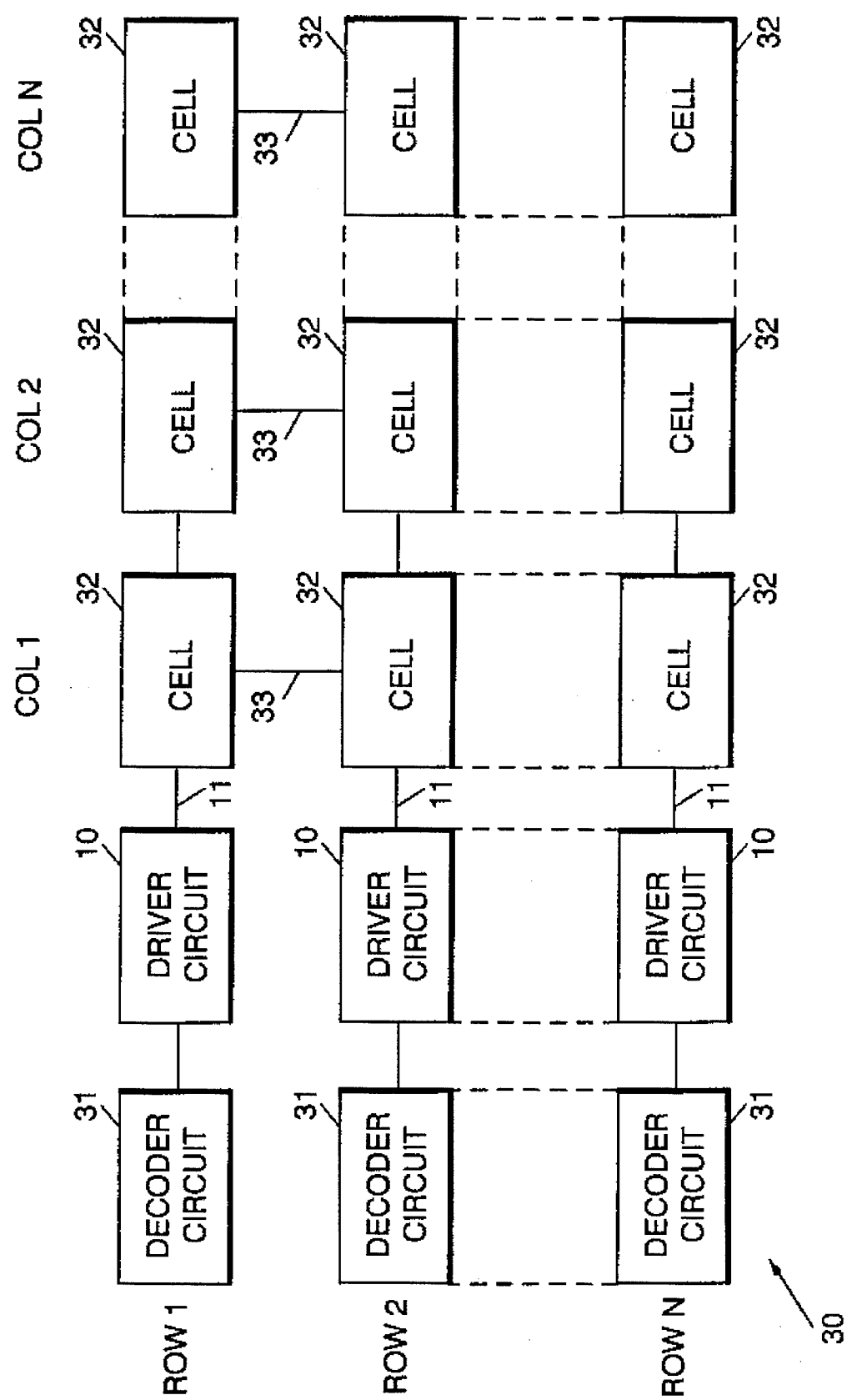
FIG. 3 illustrates a block diagram of a memory circuit configured in accordance with the present invention.

Referring to FIG. 3, there is illustrated memory circuit 30 comprising a plurality of rows and columns in which memory cells 32 are located in essentially a matrix-addressable manner. Memory circuit 30 may be a portion of a RAM or a cache. Each row of memory cells 32 is accessible by word line 11 supplied by word line driver circuit 10. Each row of memory cells 32 may be selectively addressed by decoder circuits 31 through driver circuits 10. Essentially, when any of the plurality of decoder circuits 31 provides a signal to driver circuit 10 intending to address that particular row of memory cells, driver circuit 10 will receive this address signal and produce a high signal on word line 11 to that row of memory cells 32.

Not shown is the selection and driver circuitry associated with each column of memory cells 32 for addressing each column with bit line 33. The overall operation of selectively addressing any memory cell 32 within a RAM is well-known in the art.

Figure 4:
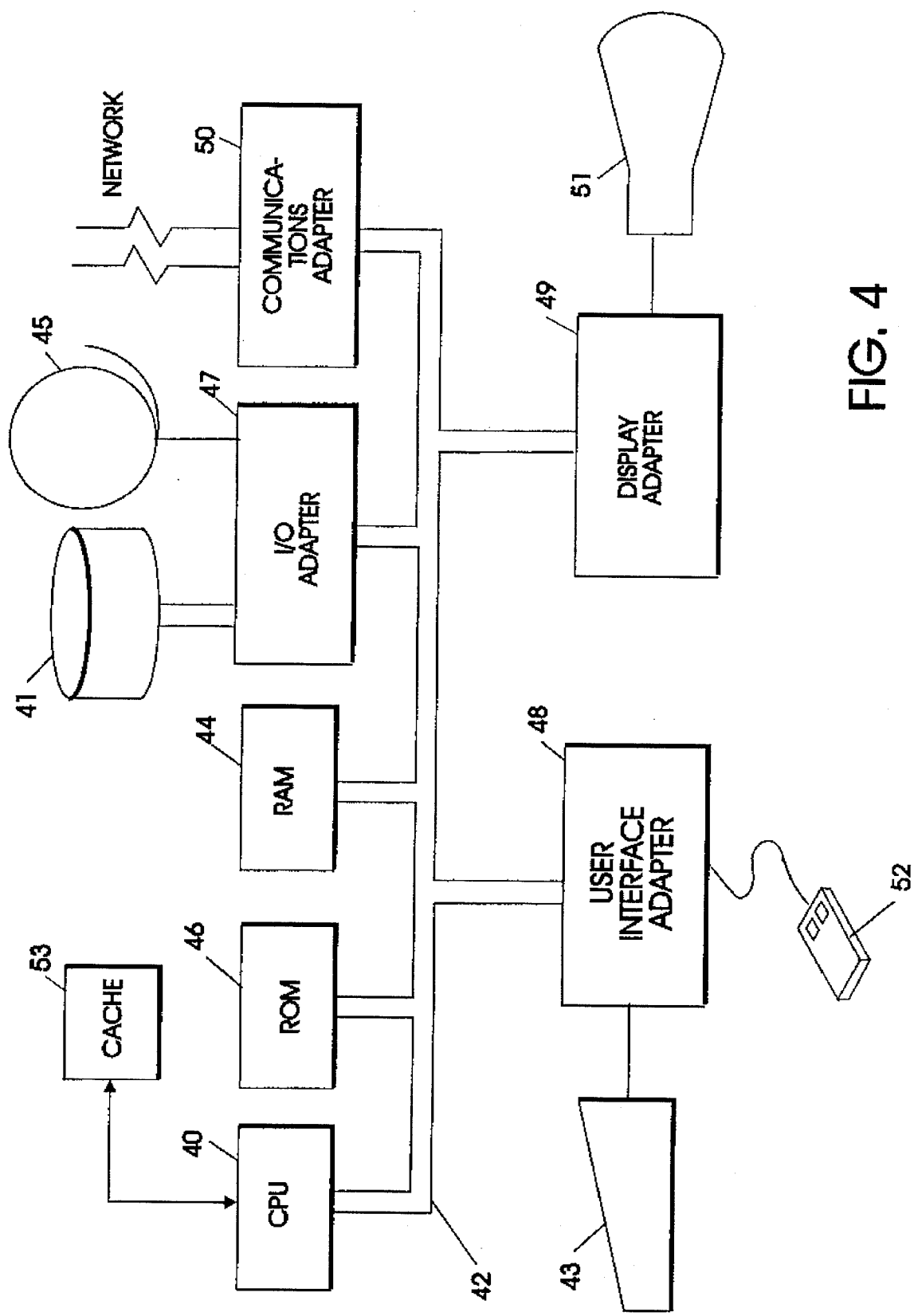
FIG. 4 illustrates a data processing system configured in accordance with the present invention.

Referring next to FIG. 4, there is illustrated a data processing system adaptable for implementing memory circuit 30 within any of the memory devices shown in FIG. 4, such as RAM 44, ROM 46, or cache 53.

The representative hardware environment for practicing the present invention depicted in FIG. 4 includes central processing unit 40, such as a conventional microprocessor, and a number of other units interconnected via system bus 42. The workstation shown in FIG. 4 includes random access memory 44, read only memory 46, and input/output (I/O) adapter 47 for connecting peripheral devices such as disk units 41 and tape drives 45 to bus 42, user interface adapter 48 for connecting keyboard 43, mouse 52, and/or other user interface devices such as a touch screen device (not shown) to bus 42, communication adapter 50 for connecting the workstation to a data processing network, and display adapter 49 for connecting bus 42 to display device 51.

Referring next to FIG. 1, there is illustrated a detailed circuit diagram of word line driver circuit 10. The circuit, being preferably made in the CMOS technology, has its p-channel field effect transistors indicated by a rectangle with a diagonal line formed therein and a gate electrode arranged adjacent thereto and its n-channel field effect transistors indicated by a rectangle without a diagonal line and a gate electrode arranged adjacent thereto. There is also provided adjacent to each depicted FET device an indication of which electrode is the source electrode (indicated by an "s"), and which electrode is a drain electrode (indicated by a "d"). Again, there are two input signals provided to circuit 10, signals IN1 and IN2, and circuit 10 outputs in response to receipt of signals IN1 and IN2 output word line signal WL on word line 11.

Within this circuit diagram, FET devices 101, 103, 104, 105 and 107 are marked to indicate that they are p-channel devices. FET devices 102, 106 and 108 are marked to indicate that they are n-channel devices. Naturally, switching devices or circuits other than FETs may be utilized, such as bipolar transistors.

There are four internal nodes within circuit 10. Internal nodes are connections within circuit 10 between two or more circuit elements, which are not directly connected to either the input or output lines. Internal node 115 is at the connection between inverter circuit element 109 and device 103. Internal node 112 is at the connection between devices 101, 102, 103, 104 and 110. Internal node 113 is at the connection between devices 104, 105, 106, 107 and 111. Internal node 114 is at the connection between devices 107, 108 and 111.

Again, as similarly described above, circuit 10 may enter into four different operational states:

(1) Signal IN2 is high and signal IN1 is low resulting in a deselected operational state for circuit 10. This condition forces node 113 to a ground potential and node 114 to a high potential (i.e., VDD). Device 104 is turned on keeping node 112 at a high potential of VDD while device 108 is turned on keeping output signal WL on word line 11 at a ground potential.

(2) Input signal IN2 is low and input signal IN1 is low also resulting in a deselected operational state for circuit 10. In this operational state, node 112 is high forcing output signal WL to a low level signal. Node 113 is high and node 114 is forced low, which keeps device 107 in a conducting state. This causes device 107 to keep node 113 at a high level. Device 101, which is turned on, keeps node 112 at a high state, which forces output signal WL to remain low.

(3) Input signal IN2 is high and input signal IN1 is high. Node 112 is forced high resulting in output signal WL being forced low. Node 113 is forced to ground and node 115 is forced high. Node 113 keeps device 108 on through device 111.

(4) IN2 is low and IN1 is high, resulting in a selected operational state. This results in node 112 being pulled low, forcing output word line signal WL high. Node 113 is precharged to VDD through devices 105 and 107. Devices 101,104 and 103 are off. Since all nodes 112, 115, 113 and 114 are forced to specific and certain states, there are no floating nodes in circuit 10 which is in contrast to the operation of prior art circuits, as discussed above. And thus, there are no oscillations of the output signal WL and no turning on and/or off of the word line which may result in an operational error (read or write).

Although the present invention and its advantages have been described in detail, it should be understood that various changes, substitutions and alterations can be made herein without departing from the spirit and scope of the invention as defined by the appended claims.

What is claimed is:

1. A memory circuit, comprising:

at least one memory cell for storing information;

a first circuit for supplying memory cell selection signals for accessing said at least one memory cell; and a second circuit, coupled between said first circuit and said at least one memory cell, for producing an address signal in response to receipt from said first circuit of said memory cell selection signals, said second circuit transmitting said address signal to said at least one memory cell, wherein said second circuit enters into an operational state when producing said address signal in response to receipt from said first circuit of said memory cell selection signals, said second circuit comprising a plurality of circuit elements coupled together by one or more nodes, wherein each of said one or more nodes has a particular voltage level during said operational state of said second circuit, and wherein said second circuit further comprises means for maintaining said each of said one or more nodes at its particular voltage level during said operational state of said second circuit, wherein said second circuit further comprises:

a first input terminal for receiving a first one of said memory cell selection signals;

a second input terminal for receiving a second one of said memory cell selection signals;

an output terminal for outputting said address signal; and first and second devices both having their first electrodes coupled to said second input terminal for receiving said second one of said memory cell selection signals, third electrodes of said first and second devices coupled together at a first one of said one or more nodes, a second electrode of said first device coupled to a first voltage reference, a second electrode of said second device coupled to a second voltage reference.

2. The memory circuit as recited in claim 1, wherein said second circuit further comprises:

ninth, tenth and eleventh devices, a third electrode of said ninth device coupled to said means for outputting said address signal, a second electrode of said ninth device coupled to said second voltage reference, a first electrode of said ninth device coupled to a second one of said one or more nodes which is coupled to a first electrode of said tenth device, a second electrode of said tenth device coupled to said first voltage reference, a third electrode of said tenth device coupled to said first one of said one or more nodes, a first electrode of said eleventh device coupled to said first one of said one or more nodes, a second electrode of said eleventh device coupled to said second one of said one or more nodes.

3. The memory circuit as recited in claim 2, wherein said first electrode is a base electrode, said second electrode is a source electrode, and said third electrode is a drain electrode.

4. A memory circuit, comprising:

at least one memory cell for storing information;

a first circuit for supplying memory cell selection signals for accessing said at least one memory cell: and a second circuit, coupled between said first circuit and said at least one memory cell, for producing an address signal in response to receipt from said first circuit of said memory cell selection signals, said second circuit transmitting said address signal to said at least one memory cell, wherein said second circuit enters into an operational state when producing said address signal in response to receipt from said first circuit of said memory cell selection signals, said second circuit comprising a plurality of circuit elements coupled together by one or more nodes, wherein each of said one or more nodes has a particular voltage level during said operational state of said second circuit, and wherein said second circuit further comprises means for maintaining said each of said one or more nodes at its particular voltage level during said operational state of said second circuit, wherein said second circuit further comprises:

a first input terminal for receiving a first one of said memory cell selection signals;

a second input terminal for receiving a second one of said memory cell selection signals;

an output terminal for outputting said address signal;

a first device having one electrode coupled to said second input terminal for receiving said second one of said memory cell selection signals; and a second device having a first electrode coupled to a second one of said one or more nodes which is coupled to a second electrode of said first device, a second electrode of said second device coupled to a first voltage reference, a third electrode coupled to said first one of said one or more nodes.

5. The memory circuit as recited in claim 4, wherein said second circuit further comprises:

a third device having a first electrode coupled to said second one of said one or more nodes, a second electrode coupled to said first voltage reference, and a third electrode coupled to said first one of said one or more nodes.

6. The memory circuit as recited in claim 5, wherein said first electrode is a base electrode, said second electrode is a source electrode, and said third electrode is a drain electrode.

7. A memory circuit, comprising:

at least one memory cell for storing information;

a first circuit for supplying memory cell selection signals for accessing said at least one memory cell; and a second circuit, coupled between said first circuit and said at least one memory cell, for producing an address signal in response to receipt from said first circuit of said memory cell selection signals, said second circuit transmitting said address signal to said at least one memory cell, wherein said second circuit enters into an operational state when producing said address signal in response to receipt from said first circuit of said memory cell selection signals, said second circuit comprising a plurality of circuit elements coupled together by one or more nodes, wherein each of said one or more nodes has a particular voltage level during said operational state of said second circuit, and wherein said second circuit further comprises means for maintaining said each of said one or more nodes at its particular voltage level during said operational state of said second circuit, a first input terminal for receiving a first one of said memory cell selection signals;

a second input terminal for receiving a second one of said memory cell selection signals;

an output terminal for outputting said address signal;

first and second devices both having their first electrodes coupled to said first input terminal for receiving said first one of said memory cell selection signals, third electrodes of said first and second devices coupled together at a first one of said one or more nodes, a second electrode of said first device coupled to a first voltage reference, a second electrode of said second device coupled to said second input terminal for receiving said second one of said memory cell selection signals; and a third device having a first electrode coupled to said first one of said one or more nodes, and a second electrode coupled to said output terminal for outputting said address signal.

8. The memory circuit as recited in claim 7, wherein said first electrode is a base electrode, said second electrode is a source electrode, and said third electrode is a drain electrode.

9. A data processing system comprising:

a processor;

at least one input/output device;

a storage device;

a display device;

a memory device; and a bus coupled to said processor, said at least one input/output device, said storage device, said display device, and said memory device, wherein said memory device further comprises:

at least one memory cell for storing information;

a decoder circuit for supplying memory cell selection signals for accessing said at least one memory cell; and a word line driver circuit, coupled between said decoder circuit and said at least one memory cell, for producing an address signal in response to receipt from said decoder circuit of said memory cell selection signals, said word line driver circuit transmitting said address signal to said at least one memory cell, wherein said word line driver circuit enters into an operational state when producing said address signal in response to receipt from said decoder circuit of said memory cell selection signals, said word line driver circuit comprising a plurality of circuit elements coupled together by one or more nodes, wherein each of said one or more nodes has a particular voltage level during said operational state of said word line driver circuit, and wherein said word line driver circuit further comprises means for maintaining said each of said one or more nodes at its particular voltage level during said operational state of said word line driver circuit, wherein said one or more nodes are internal to said word line driver circuit, wherein a node is an electrical circuit connection between any two or more of said plurality of circuit elements, wherein said word line driver circuit further comprises:

means for receiving a first one of said memory cell selection signals;

means for receiving a second one of said memory cell selection signals;

means for outputting said address signal;

first and second devices both having their first electrodes coupled to said means for receiving said first one of said memory cell selection signals, third electrodes of said first and second devices coupled together at a first one of said one or more nodes, a second electrode of said first device coupled to a first voltage reference, a second electrode of said second device coupled to said means for receiving said second one of said memory cell selection signals;

third and fourth devices both having their first electrodes coupled to said means for receiving said second one of said memory cell selection signals, third electrodes of said third and fourth devices coupled together at a second one of said one or more nodes, a second electrode of said third device coupled to said first voltage reference, a second electrode of said fourth device coupled to a second voltage reference;

a fifth device having one electrode coupled to said means for receiving said second one of said memory cell selection signals;

a sixth device having a first electrode coupled to a third one of said one or more nodes which is coupled to a second electrode of said fifth device, a second electrode of said sixth device coupled to said first voltage reference, a third electrode coupled to said first one of said one or more nodes;

a seventh device having a first electrode coupled to said second one of said one or more nodes, a second electrode coupled to said first voltage reference, and a third electrode coupled to said first one of said one or more nodes;

an eighth device having a first electrode coupled to said first one of said one or more nodes, and a second electrode coupled to said means for outputting said address signal; and ninth, tenth and eleventh devices, a third electrode of said ninth device coupled to said means for outputting said address signal, a second electrode of said ninth device coupled to said second voltage reference, a first electrode of said ninth device coupled to a fourth one of said one or more nodes which is coupled to a first electrode of said tenth device, a second electrode of said tenth device coupled to said first voltage reference, a third electrode of said tenth device coupled to said second one of said one or more nodes, a first electrode of said eleventh device coupled to said second one of said one or more nodes, a second electrode of said eleventh device coupled to said fourth one of said one or more nodes.

10. A memory circuit, comprising:

at least one memory cell for storing information;

a first circuit for supplying memory cell selection signals for accessing said at least one memory cell; and a second circuit, coupled between said first circuit and said at least one memory cell, for producing an address signal in response to receipt from said first circuit of said memory cell selection signals, said second circuit transmitting said address signal to said at least one memory cell, wherein said second circuit enters into an operational state when producing said address signal in response to receipt from said first circuit of said memory cell selection signals, said second circuit comprising a plurality of circuit elements coupled together by one or more nodes, wherein each of said one or more nodes has a particular voltage level during said operational state of said second circuit, and wherein said second circuit further comprises means for maintaining said each of said one or more nodes at its particular voltage level during said operational state of said second circuit, wherein said second circuit further comprises:

means for receiving a first one of said memory cell selection signals;

means for receiving a second one of said memory cell selection signals;

means for outputting said address signal;

first and second devices both having their first electrodes coupled to said means for receiving said first one of said memory cell selection signals, third electrodes of said first and second devices coupled together at a first one of said one or more nodes, a second electrode of said first device coupled to a first voltage reference, a second electrode of said second device coupled to said means for receiving said second one of said memory cell selection signals; and third and fourth devices both having their first electrodes coupled to said means for receiving said second one of said memory cell selection signals, third electrodes of said third and fourth devices coupled together at a first one of said one or more nodes, a second electrode of said third device coupled to a first voltage reference, a second electrode of said fourth device coupled to a second voltage reference.

* * * * *